United States Patent
Shigeto et al.

(10) Patent No.: US 9,058,957 B2
(45) Date of Patent: Jun. 16, 2015

(54) CHARGED PARTICLE BEAM APPARATUS

(75) Inventors: Kunji Shigeto, Tokyo (JP); Mitsugu Sato, Tokyo (JP); Noriko Iizumi, Tokyo (JP); Hiroyuki Noda, Tokyo (JP); Masako Nishimura, Tokyo (JP); Shunya Watanabe, Tokyo (JP); Mami Konomi, Tokyo (JP); Shinichi Tomita, Tokyo (JP); Ryuichiro Tamochi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/232,279

(22) PCT Filed: May 28, 2012

(86) PCT No.: PCT/JP2012/003449
§ 371 (c)(1),
(2), (4) Date: Jan. 12, 2014

(87) PCT Pub. No.: WO2013/035220
PCT Pub. Date: Mar. 14, 2013

(65) Prior Publication Data
US 2014/0131590 A1    May 15, 2014

(30) Foreign Application Priority Data
Sep. 5, 2011 (JP) .................................. 2011-192273

(51) Int. Cl.
*H01J 37/153* (2006.01)
*H01J 37/10* (2006.01)
*H01J 37/28* (2006.01)
*H01J 37/26* (2006.01)

(52) U.S. Cl.
CPC ............ *H01J 37/153* (2013.01); *H01J 37/28* (2013.01); *H01J 2237/1532* (2013.01); *H01J 2237/21* (2013.01); *H01J 37/10* (2013.01); *H01J 37/265* (2013.01)

(58) Field of Classification Search
CPC .................... H01J 2237/1532; H01J 2237/21; H01J 37/10; H01J 37/153; H01J 37/265; H01J 37/28; H01J 37/222; H01J 2237/20228; H01J 2237/2806; H01J 37/304
USPC .......... 250/306, 307, 310, 311, 396 R, 492.1; 703/6, 13
See application file for complete search history.

(56) References Cited

U.S. PATENT DOCUMENTS

| | | | |
|---|---|---|---|
| 4,392,054 A * | 7/1983 | Sato et al. ...................... 250/307 |
| 6,437,330 B1 * | 8/2002 | Sugiyama ...................... 250/309 |
| 7,026,614 B2 * | 4/2006 | Saitoh ............................ 250/307 |
| 7,071,969 B1 * | 7/2006 | Stimson, III ............. 348/207.11 |
| 2003/0155494 A1 * | 8/2003 | Olschewski .................. 250/234 |
| 2005/0035290 A1 * | 2/2005 | Saitoh ............................ 250/307 |
| 2007/0020605 A1 * | 1/2007 | Berger et al. ................. 434/365 |

FOREIGN PATENT DOCUMENTS

| JP | 2005-302468 A | 10/2005 |
|---|---|---|
| JP | 2010-157370 A | 7/2010 |

* cited by examiner

*Primary Examiner* — Michael Logie
(74) *Attorney, Agent, or Firm* — Miles & Stockbridge P.C.

(57) ABSTRACT

A charged particle beam apparatus is provided with a parameter adjustment practice function for allowing any user to easily learn manual focus adjustment and stigma adjustment. Control conditions of the focus arrangement of an objective lens, an X-stigmator and a Y-stigmator are set according to the user's operation. According to a group of the focus adjustment, an X-stigma adjustment and a Y-stigma adjustment which are set, a practice-purpose image corresponding to the control conditions is read out from a storage device and is displayed on a screen.

8 Claims, 7 Drawing Sheets

CHARGED PARTICLE BEAM APPARATUS

TECHNICAL FIELD

The present invention relates to a function for assisting in learning a charged particle beam adjustment technology for a charged particle beam apparatus.

BACKGROUND ART

A charged particle beam apparatus represented by a scanning electron microscope scans a desired region (field of view) on a sample by using a charged particle beam and records a charged particle signal emitted from the scanning region in response to a scanning position, thereby acquiring an image of an observation object. Since a beam size and a beam shape on the sample greatly affect an image quality, an apparatus user performs a focus adjustment and a stigma adjustment. The stigma adjustment requires two parameter adjustments of an X-stigma adjustment and a Y-stigma adjustment. Accordingly, the number of parameters to be adjusted in addition to a focus adjustment is three. The adjustment of three parameters is not easy to perform, thereby leading to one factor that the image quality of the acquired image is dependent on a skill level of the apparatus user. Therefore, an auto adjustment function, such as an auto focus adjustment and an auto stigma adjustment, has been developed and has been actually used in a testing apparatus and a measurement apparatus which are directed to a specified sample. However, in a case of a highly versatile apparatus having a wide range of observation samples, the automatic adjustment frequently fails and thus the automatic adjustment function is rarely used. Accordingly, the apparatus user is required to learn a manual adjustment technology as soon as possible.

PTL 1 proposes a display method and a display apparatus of a simulation image in a charged particle beam apparatus that enables a user to learn a difficult technology of aberration correction and that facilitate understanding of procedures.

PTL 2 proposes an apparatus that assists in understanding of apparatus functions by visualizing and displaying a focus position of an electron beam of the scanning electron microscope and lens intensity.

CITATION LIST

Patent Literature

PTL 1: JP-A-2005-302468
PTL 2: JP-A-2010-157370

SUMMARY OF INVENTION

Technical Problem

In the related art, a charged particle beam apparatus such as a scanning electron microscope is expensive and thus is used by only professionals. However, in recent years, the charged particle beam apparatus such as the scanning electron microscope is no longer a special apparatus which is limitedly used, and thus, a range of users has broadened. It is necessary for any user to learn a manual adjustment technology, but it is very difficult to adjust all parameters for observation to have an appropriate value. Nevertheless, in the related art, a parameter adjustment technology has to be learned through repeated operation experiences of the apparatus. Therefore, it has been difficult for a beginner to sufficiently show performance of the apparatus.

Although a focus adjustment and a stigma adjustment are particularly essential in observation, since three parameters which have to be simultaneously adjusted as described above, a user other than a skilled person has difficulties in adjustment.

Furthermore, parameters other than the focus adjustment and the stigma adjustment can be dealt with if the skilled person sets the parameter in advance, but it is necessary to constantly perform the focus adjustment and the stigma adjustment. Moreover, these parameters greatly affect an image quality in an acquired image.

The present invention aims to provide a charged particle beam apparatus which includes parameter adjustment practice means that allows any person to easily learn a manual adjustment technology.

Solution to Problem

In order to solve the above-described problem, a charged particle beam apparatus is provided with a practice function for a focus adjustment and a stigma adjustment.

Based on a user's operation, a focus adjustment of an objective lens and a control condition of an X-stigmator and a y-stigmator are set. According to a set of the set focus adjustment and an X-stigma adjustment and a Y-stigma adjustment, a practice-purpose image corresponding to the control condition is read out from a storage device and is displayed on a screen.

Advantageous Effects of Invention

Since the present invention enables a user to easily understand procedures and policies in adjustment, the user can easily learn a manual adjustment technology. Accordingly, even a beginner can sufficiently show performance of an apparatus.

DESCRIPTION OF EMBODIMENTS

Hereinafter, embodiments of the present invention will be described with reference to the drawings.

In the embodiments described below, as an aspect of a charged particle beam apparatus which requires a focus adjustment and a stigma adjustment, a scanning electron microscope (SEM) will be described by way of example, but embodiments are not limited thereto. For example, the embodiment can also be applied to a focused ion beam apparatus which emits an ion beam irradiated from a liquid metal ion source or a gas ion source to a sample.

The following embodiments include an example where the charged particle beam apparatus is provided with practice functions for practicing adjustment of observation conditions. However, the embodiments may be realized by a computer such as a machine used exclusively for practice where these functions are operated by a program and which is disposed separately from the charged particle beam apparatus. When operated by the program, the practice functions of the invention can be provided by upgrading the existing charged particle beam apparatus.

Embodiment 1

Figure 1:
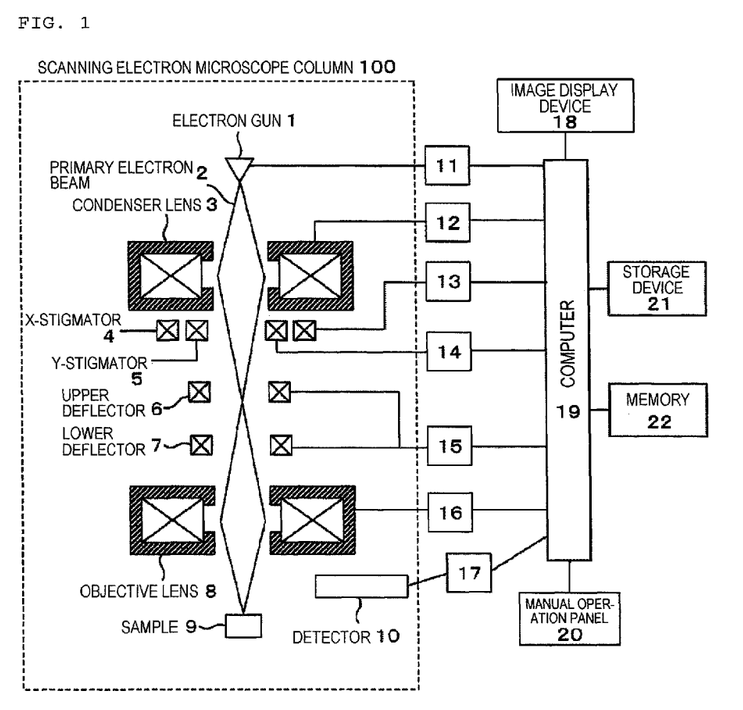
FIG. 1 is a schematic configuration diagram of a scanning electron microscope according to the present invention.

FIG. 1 is a schematic configuration diagram illustrating an example of a scanning electron microscope according to the present invention. A primary electron beam 2 emitted from an electron gun 1 is condensed by a condenser lens 3 and an objective lens 8, and is caused to scan a sample 9 by an upper deflector 6 and a lower deflector 7. A signal electron generated by the sample 9 is detected by a detector 10, and a signal recorded corresponding to a scanning position is displayed on an image display device 18. Since the primary electron beam 2 is focused in a punctiform on the sample 9, an X-stigmator 4 and a Y-stigmator 5 are disposed to adjust control conditions thereof, thereby enabling astigmatism correction. In addition, it is possible to focus on the sample by adjusting excitation intensity of the condenser lens 3 or the objective lens 8. An electron optical system described above is accommodated in a scanning electron microscope column 100. In addition, these are controlled by a computer 19 through a high voltage control circuit 11, a focusing lens control circuit 12, an X-stigmator control circuit 13, a Y-stigmator control circuit 14, a deflector control circuit 15, an objective lens control circuit 16 and a detection signal control circuit 17. Each of the control circuits may be separately disposed, may be disposed on a single substrate or may be included in the computer 19. The image display device 18, a manual operation panel 20, a storage device 21 and a memory 22 are connected to the computer 19. An apparatus user performs the focus adjustment of the objective lens 8 and the stigma adjustment of the X-stigmator 4 and the Y-stigmator 5 through the manual operation panel 20. The practice-purpose image according to the present embodiment is pre-stored in the storage device 21. In addition, if the computer 19 is connected to a network, the practice-purpose image may be stored in another storage device which is connected to the network.

Here, the practice-purpose image represents an image displayed according to a user's operation in practice functions to be described below, and each practice-purpose image is pre-stored corresponding to a set of three parameters adapted to have the focus adjustment, the X-stigma correction adjustment and the Y-stigma correction adjustment. That is, the practice-purpose image is an image which is expected to be obtained when the charged particle beam apparatus is controlled by using the set of parameters corresponding to the practice-purpose image and an image is acquired by emitting a charged particle beam. The practice-purpose image may be acquired in advance by actually emitting the charged particle beam under a condition that the practice-purpose image is adapted to have the respective set of parameters, or may be obtained in advance through simulation.

Since the optimum focus adjustment and stigma adjustment vary depending on samples, it is necessary to adjust the optimum value whenever the user replaces the samples. In addition, if an observation field of view varies, even in the same sample, the optimum focus adjustment and stigma adjustment vary accordingly. The user performs the focus adjustment and the stigma adjustment by operating the manual operation panel 20 while viewing the image displayed on the image display device 18.

Figure 2:
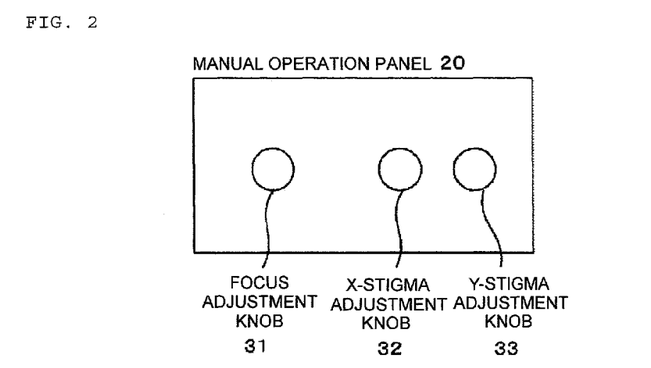
FIG. 2 is a schematic configuration diagram of a manual operation panel.

FIG. 2 illustrates an example of the manual operation panel 20. A focus adjustment knob 31 is generally connected to the objective lens 8, but even if connected to the condenser lens 3, can perform the focus adjustment. An X-stigma adjustment knob 32 and a Y-stigma adjustment knob 33 are respectively connected to the X-stigmator 4 and the Y-stigmator 5 through the computer and the respective control circuits. In the following embodiments including the present embodiment, the focus adjustment or the stigma adjustment is performed by using the manual operation panel 20, but the embodiments are not limited thereto. For example, a general purpose mouse or keyboard which is connected to the computer 19 may be used.

In order to acquire a high quality image by using the charged particle beam apparatus represented by the scanning electron microscope, it is necessary to manually adjust at least three parameters in total for the focus adjustment and two types of the stigma adjustment. Therefore, it is difficult to reach the optimum value by the adjustment without any clear policy, thereby causing a large individual difference in the image quality of the acquired image.

In addition, if the electron beam is emitted to the sample for a long period of time, the sample is destroyed in some cases. Accordingly, it is necessary to quickly adjust the apparatus to have optimum conditions. However, in the related art, since the charged particle beam apparatus starting with the scanning electron microscope is mainly used by professionals, there has been no practice function focusing on theses parameters required for acquiring the image at the minimum.

PTL 1 described above utilizes simulation that assists the user in learning a technology of aberration correction which is difficult for even the professionals to learn. PTL 1 does not focus on these three parameters which are essential to the adjustment when acquiring the image. In addition, it is desirable that a changing speed of the practice-purpose image according to the operation on the manual operation panel 20 is identical to an actual operation. However, if the simulation is repeated for every parameter as disclosed in PTL 1, it is difficult to ensure a response speed.

Figure 4:
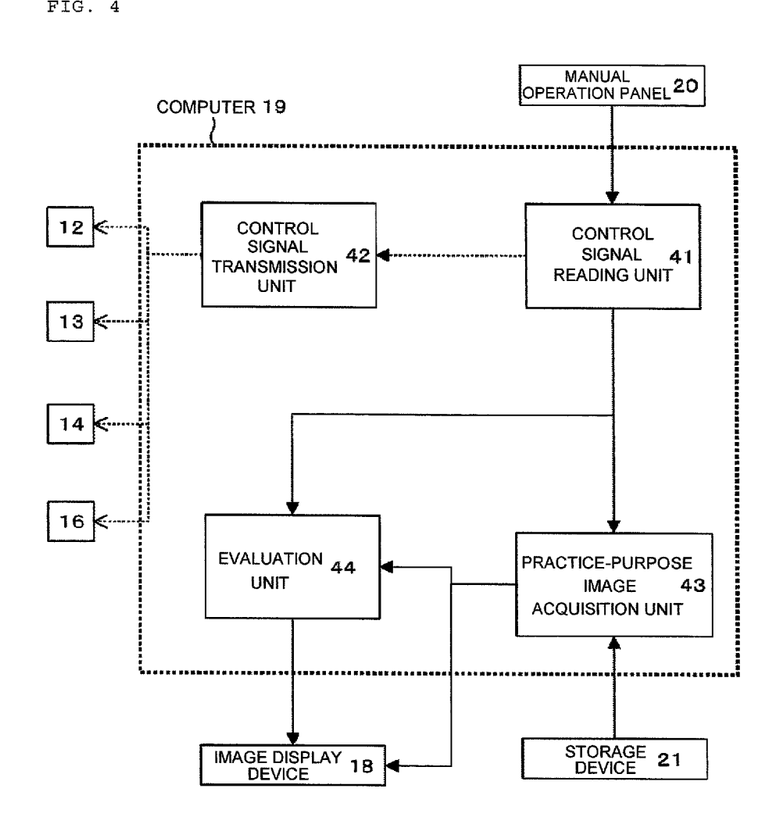
FIG. 4 is a functional block diagram of a computer which includes focus and stigma adjustment practice functions.
Figure 5:
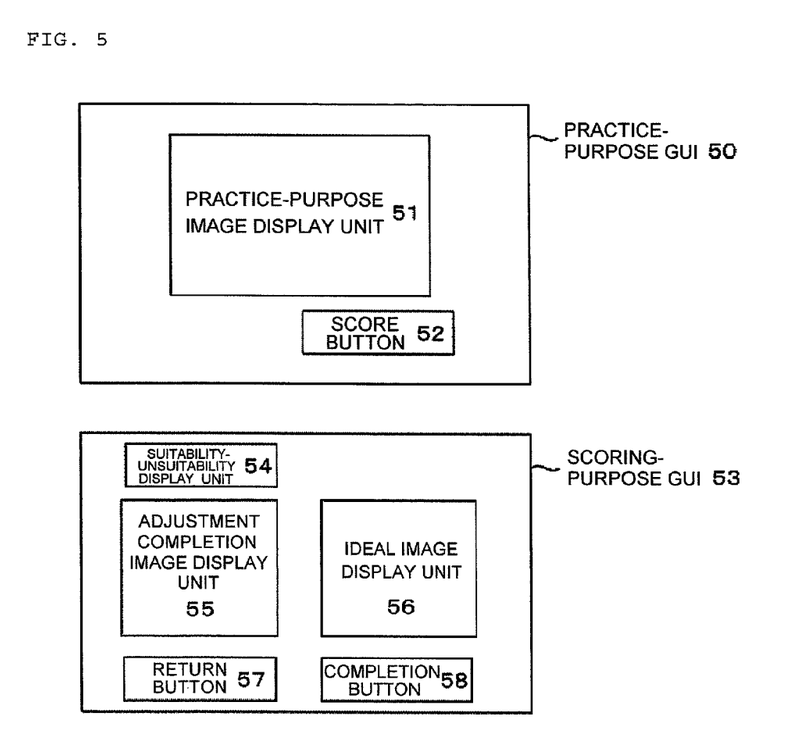
FIG. 5 is a GUI illustrating a practice-purpose image.

Hereinafter, the charged particle beam apparatus provided with the function for practicing the parameters in the present embodiment will be described with reference to FIGS. 3 to 5.

If the function for practicing the focus adjustment and the stigma adjustment is switched on the computer 19, a normal observation mode is switched over to a practice mode. In the present embodiment, since the charged particle beam apparatus itself includes the practice function, switching means is disposed. However, when performing the practice through the other computer such as a machine used exclusively for practice by using certain programs, the switching means may not be disposed.

If the function for practicing the focus adjustment and the stigma adjustment (step 31 in FIG. 3) starts, the manual operation panel 20 and the scanning electron microscope column 100 are disconnected from each other. This is because if not disconnected from each other, the charged particle beam is actually emitted for the adjustment practice, thereby leading to a failure of the apparatus or destruction of the sample.

Figure 3:
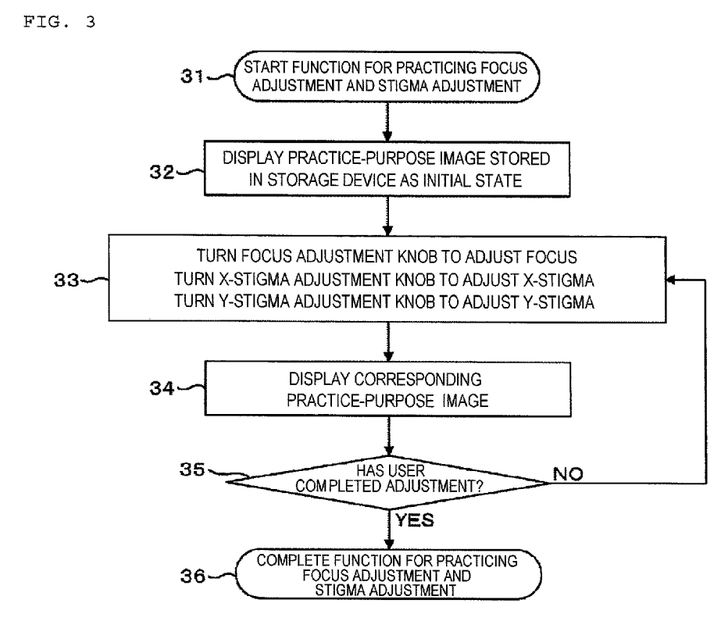
FIG. 3 is a flowchart of focus and stigma adjustment practices in Embodiment 1.

Next, the practice-purpose image in an initial state is displayed (step 32 in FIG. 3). The practice-purpose image in the initial state is displayed in such a manner that a practice-purpose image acquisition unit 43 reads the practice-purpose image from the storage device 21 and outputs the practice-purpose image to the image display device 18. The practice-purpose image in the initial state represents a practice-purpose image displayed before a user performs the adjustment. That is, the practice-purpose image displayed at this time is not a good quality image since the focus adjustment or the stigma adjustment does not have the optimum value. The initial state may be fixed to several images in advance or may be selected at random after the practice function is started.

If the user operates the focus adjustment knob 31, the X-stigma adjustment knob 32 and the Y-stigma adjustment knob 33, a control signal for the focus adjustment and the stigma adjustment performed by the user is transmitted from the manual operation panel 20 to each control circuit through the computer 19 (step 33 in FIG. 3). A control signal reading unit 41 reads the control signal and transmits the control signal to the practice-purpose image acquisition unit 43 and an evaluation unit 44. During a mode for observing a normal sample, the control signal output from the manual operation panel 20 is output to each control circuit through the control signal reading unit 41 and a control signal transmission unit 42. However, it is not necessary to emit the charged particle beam to the sample in a state where the practice function is switched on. Therefore, the control signal reading unit 41 does not require the output of the control signal to the control signal transmission unit 42 and each control circuit (dashed arrow portion in FIG. 4).

The storage device 21 stores the respective images for the set of three parameters of a plurality of predetermined focus adjustments and the X/Y-stigma adjustments. The practice-purpose image acquisition unit 43 included in the computer 19 acquires the image corresponding to the focus adjustments and the X/Y-stigma adjustments performed by the user from the storage device 21 and displays the image on the image display device 18 in real time (step 34 in FIG. 3). In the present embodiment, since the practice-purpose image corresponding to the set of the respective parameters is stored in advance, it is not necessary to perform the simulation for each adjustment of the user. Accordingly, the practice-purpose image can be displayed in real time, thereby enabling the user to practice the adjustments with a feeling close to an operation feeling during the emission of the charged particle beam.

Here, a graphical user interface (GUI) displayed on the image display device 18 will be described with reference to FIG. 5.

The function for practicing the focus adjustment and the stigma adjustment is switched on through the computer 19, a practice-purpose GUI 50 is displayed. The practice-purpose image corresponding to the adjustment parameters is displayed on a practice-purpose image display unit 51 and the image corresponding to the parameters adjusted by the user is displayed thereon.

At this time, it is not confirmed whether the focus adjustment and the stigma adjustment which are determined as the optimum value by the user is really the optimum value or not. Therefore, when the user notifies the computer that the focus adjustment is completed by means of a button operation or the like on a GUI screen, it is preferable to display the image having the optimum value in advance. This facilitates an operator to recognize which image is the optimum image. In this case, it is preferable to display the image by comparing the image displayed when the user determines that the adjustment is completed, with the image according to the set of the optimum parameters (hereinafter, referred to as an ideal image).

Alternatively, it is preferable to evaluate whether the adjustment is really made to have the optimum value. In the present embodiment, the evaluation unit 44 is disposed in the computer 19. The evaluation unit 44 compares the set of parameters when the adjustment is determined to be completed with the set of parameters determined as the optimum value in advance (set of optimum parameters). The evaluation unit 44 reads the set of parameters which are set by the user when determining that the adjustment is completed, from the control signal reading unit 41, determines whether the set of read parameters coincides with the set of optimum parameters, and outputs the result to the image display device 18. The set of optimum parameters is used as a so-called correct value, and is determined in one set for one practice-purpose image in the initial state.

The set of parameters determined as the optimum value in advance may be read from the storage device 21, or may be stored in a memory (not illustrated) inside the evaluation unit 44. A deviation between the sets may be displayed as the output, or the deviation may be scored to display the result. In addition, it may be determined as suitable or unsuitable by displaying true-false marks. If the user presses a score button 52 after determining that the adjustment can have the optimum value, a scoring-purpose GUI 53 for scoring is displayed. An adjustment completion image which is determined by the user that the adjustment can have the optimum value is displayed on an adjustment completion image display unit 55, and in comparison, the ideal image which actually has the optimum value is displayed on an ideal image display unit 56, and then the scores or the true-false marks are displayed on a suitability-unsuitability display unit 54.

When it is determined that the adjustment is not completed through the evaluation of the evaluation unit 44, a screen re-prompting the user to perform the adjustment may be displayed. If a return button 57 is pressed, the screen returns to the practice-purpose GUI 50, thereby enabling the adjustment practice again. If a completion button 58 is pressed, the practice function is completed (step 36 in FIG. 3).

Figure 6:
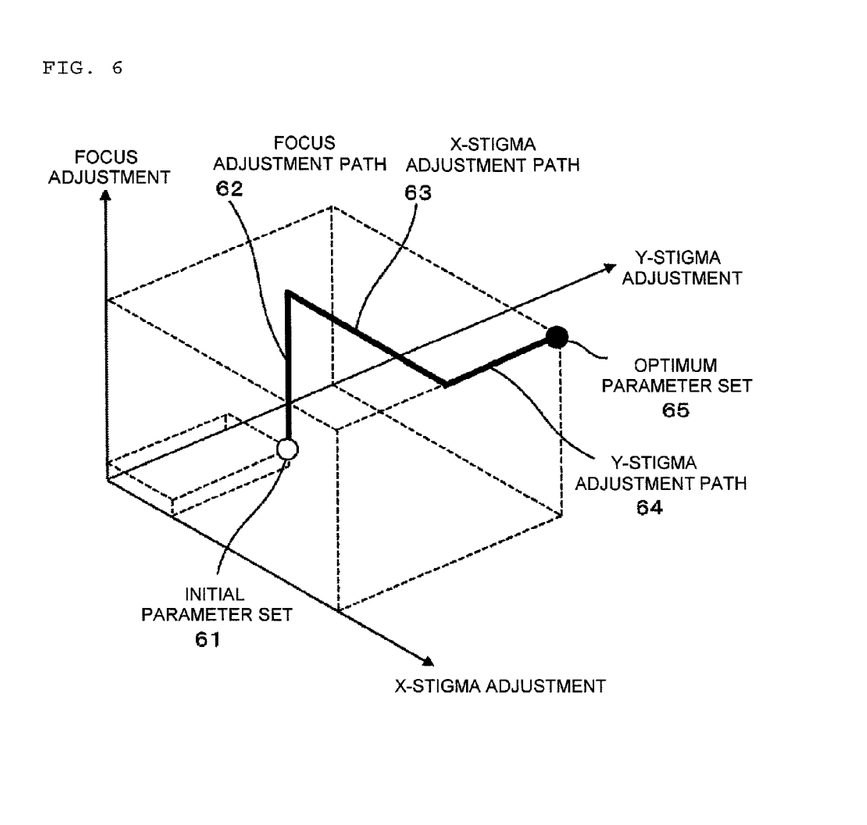
FIG. 6 is an adjustment path diagram in an adjustment parameter space.

In order to visually display an adjustment path, FIG. 6 illustrates a graph by using axes of three parameters of the focus adjustment, the X-stigma adjustment and the Y-stigma adjustment. Hereinafter, a space indicated by the graph is referred to as an adjustment parameter space. Each coordinate on the space in FIG. 6 indicates the set of three parameters. The adjustment is completed when starting from an initial parameter set 61 and reaching an optimum parameter set 65 via a focus adjustment path 62, an X-stigma adjustment path 63 and a Y-stigma adjustment path 64. The adjustment path illustrated here is the shortest path. The user usually performs the focus adjustment and the X/Y-stigma adjustments while undergoing trial and error. Therefore, it is not possible to perform the adjustment practice by merely preparing the image on this path. As an ideal manner, in each coordinate of a three-dimensional space illustrated in FIG. 6, it is preferable to allow the storage device to prepare the practice-purpose image which is expected to be acquired when the charged particle beam is emitted by using the set of parameters corresponding to a coordinate value thereof.

Hitherto, by using the charged particle beam apparatus including adjustment practice means for the focus adjustment and the X/Y-stigma adjustment which are described in the present embodiment, even a user who is the beginner can easily understand the procedures and the policies of the adjustment and can easily learn the manual adjustment technology. In addition, since anybody can perform the focus adjustment and the X/Y-stigma adjustment with a constant policy, an individual difference no longer exists in the quality of the acquired image. Therefore, even the beginner can sufficiently show the performance of the apparatus.

Embodiment 2

Embodiment 1 is configured to store the practice-purpose image in advance with respect to each point included in the adjustment parameter space, that is, all the sets of parameters. However, the storage device 21 has a limited capacity and thus, it is not a realistic way to prepare the practice-purpose image for all the combinations of selectable parameters. In addition, there is no reason to use the practice-purpose image prepared corresponding to all coordinate points in the above-described adjustment parameter space for a one-time practice. Accordingly, it is not the realistic way in view of efficiency in using the practice-purpose image.

Therefore, in the present embodiment, there is a limitation on the adjustment procedure for the focus adjustment, the X-stigma adjustment and the Y-stigma adjustment. This limits the practice-purpose image to be used in the practice function. Accordingly, less storage capacity is required since it is not necessary to prepare the practice-purpose image for all the sets of parameters.

Furthermore, if the adjustment procedure is not determined, three parameters are simultaneously changed, thereby causing the beginner to have difficulties particularly in the adjustment. If the adjustment procedure is determined, even the beginner can perform the adjustment based on a clear policy. The individual difference no longer exists in the quality of the acquired image, and thus, anybody can acquire the image having a constant quality.

Hereinafter, configuring elements the same as those in Embodiment 1 will not be repeatedly described.

Figure 7:
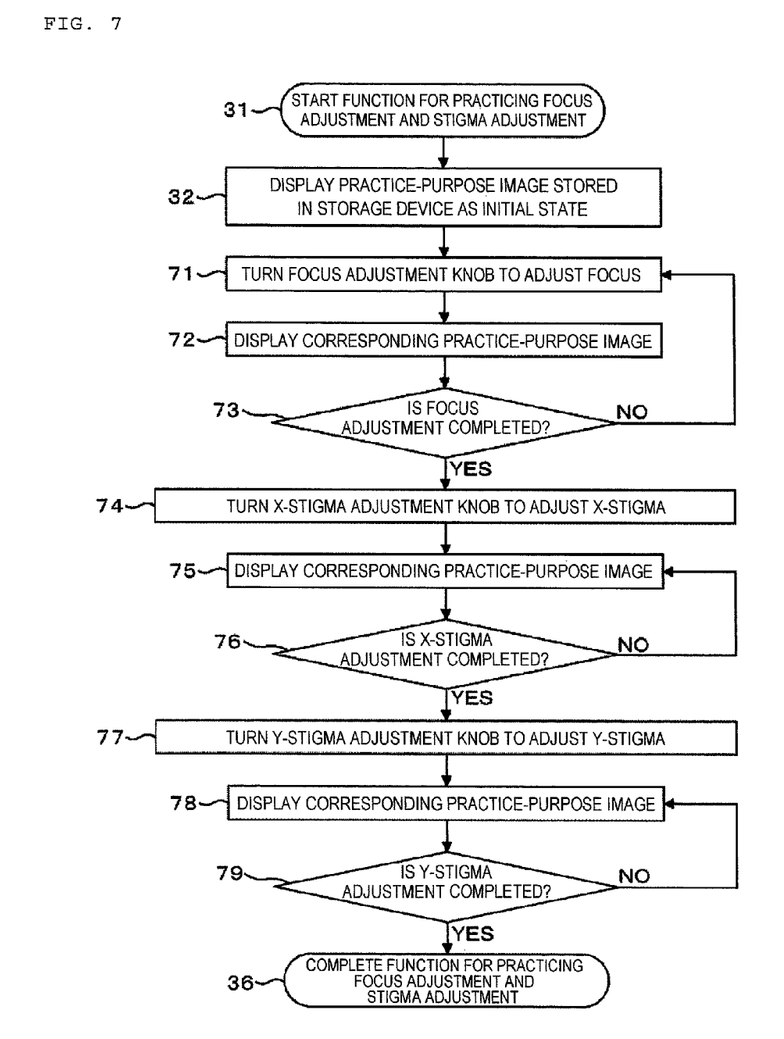
FIG. 7 is a flowchart of focus and stigma adjustment practices in Embodiment 2.

In FIG. 7, the procedure is sequentially the focus adjustment, the X-stigma adjustment and the Y-stigma adjustment, but the procedure the X-stigma adjustment and the Y-stigma adjustment may be reversed. If the stigma adjustment is performed in a state of completing the focus adjustment, a sharp image can be obtained under the optimum condition, thereby leading to an easy adjustment. However, if the stigma adjustment is performed in a state where the focus adjustment is not completed, a blurred image is obtained under the optimum condition, thereby resulting in a difficult adjustment. Therefore, it is necessary to perform the focus adjustment first.

Hereinafter, the present embodiment will be described with reference to FIGS. 7 and 8.

In FIG. 7, the procedure until the practice-purpose image of the initial state is displayed is the same as that of Embodiment 1 (steps 31 and 32 in FIG. 7). In the present embodiment, the parameter to be subsequently adjusted is limited to the focus adjustment. If the user operates the focus adjustment knob 31 of the manual operation panel 20 (step 71 in FIG. 7), similar to Embodiment 1, the practice-purpose image corresponding to the focus adjustment operated by the user is displayed (step 72 in FIG. 7).

The user confirms the displayed practice-purpose image and repeatedly performs the focus adjustment until the user determines that the focus adjustment can be completed to have the optimum value. During the focus adjustment, the X-stigma adjustment and the Y-stigma adjustment fixedly remain in the initial state.

Figure 8:
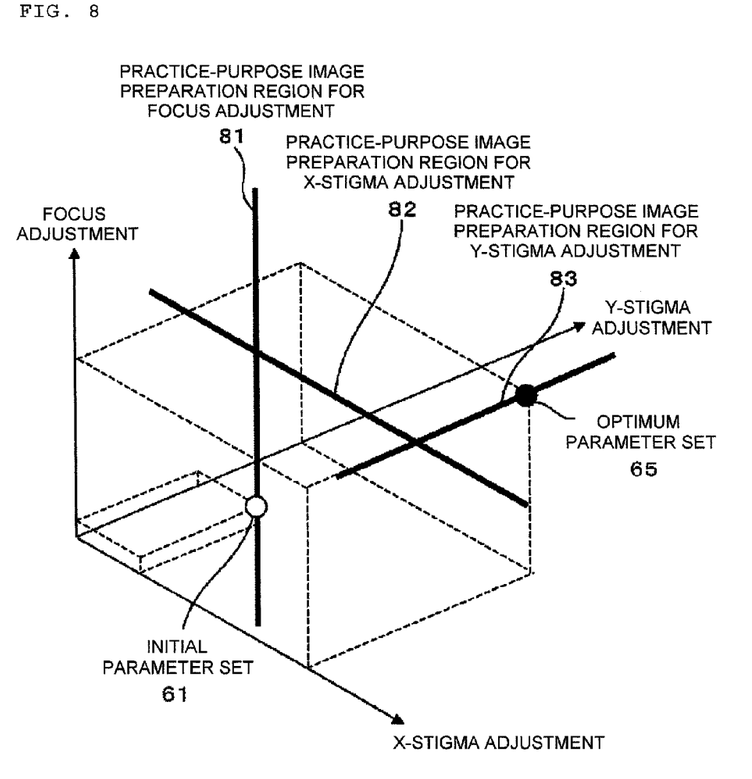
FIG. 8 illustrates an image preparation region in an adjustment parameter space.

In this step, a group of images used as the practice-purpose image is included in a practice-purpose image preparation region 81 for the focus adjustment in FIG. 8.

When the user determines that the focus adjustment is completed to have the optimum value, the user notifies the computer 19 of the intention that the focus adjustment is completed (step 73 in FIG. 7). If the evaluation unit 44 of the computer 19 determines that the focus adjustment has the optimum value, the step proceeds to the next step. When the focus adjustment does not have the optimum value, the evaluation unit 44 displays a message notifying the intention that the focus adjustment is required again, on the screen, and prompts the user to perform the adjustment again. Here, similar to Embodiment 1, a process of scoring may be performed which evaluates a state of the user's adjustment.

If the focus adjustment is completed, a message indicating the intention that the X-stigma adjustment is subsequently performed is displayed on the image display device (step 74 in FIG. 7).

If the user operates the X-stigma adjustment knob 32 of the manual operation panel 20, similar to Embodiment 1, the practice-purpose image corresponding to the X-stigma adjustment performed by the user is displayed (step 75 in FIG. 7).

The user confirms the displayed practice-purpose image and repeatedly performs the focus adjustment until the user determines that the focus adjustment can be completed to have the optimum value. In this step, it has been already guaranteed that the focus adjustment is set to have the optimum value. Therefore, the focus adjustment is fixed to the optimum value, the Y-stigma adjustment is fixed to the initial state and only the X-stigma adjustment is set to be adjustable.

In this step, a group of images used as the practice-purpose image is included in a practice-purpose image preparation region 82 for the X-stigma adjustment in FIG. 8. In FIG. 8, the practice-purpose image preparation region 82 for the X-stigma adjustment is illustrated by a straight line, but may be a region having a width to some extent in view of an adjustment error in the focus adjustment step.

When the user determines that the X-stigma adjustment is completed to have the optimum value, the user notifies the computer 19 of the intention that the X-stigma adjustment is completed (step 76 in FIG. 7). If the evaluation unit 44 of the computer 19 determines that the X-stigma adjustment has the optimum value, the step proceeds to the next step. If the X-stigma adjustment does not have the optimum value, a message notifying that it is necessary to perform the X-stigma adjustment again is displayed on the screen so as to prompt the user to perform the adjustment again. Here, similar to Embodiment 1, a process of scoring may also be performed which evaluates a state of the user's adjustment.

If the X-stigma adjustment is completed, a message notifying that the Y-stigma adjustment is subsequently performed (step 77 in FIG. 7) is displayed on the image display device 18.

If the user operates the Y-stigma adjustment knob 33 of the manual operation panel 20, similar to Embodiment 1, the practice-purpose image corresponding to the Y-stigma adjustment operated by the user is displayed (step 78 in FIG. 7).

The user confirms the displayed practice-purpose image and repeatedly performs the Y-stigma adjustment until the user determines that the Y-stigma adjustment can be completed to have the optimum value. In this step, it has been already guaranteed that the focus adjustment and the X-stigma adjustment are set to have the optimum value. Therefore, the focus adjustment and the X-stigma adjustment are fixed to the optimum value, and only the Y-stigma adjustment is set to be adjustable.

In this step, a group of images used as the practice-purpose image is included in a practice-purpose image preparation region 83 for the Y-stigma adjustment in FIG. 8. In FIG. 8, the practice-purpose image preparation region 83 for the Y-stigma adjustment is illustrated by a straight line, but may be a region having a width to some extent in view of an adjustment error in the focus adjustment step and the X-stigma adjustment step.

When the user determines that the Y-stigma adjustment is completed to have the optimum value, the user notifies the computer 19 of the intention that the Y-stigma adjustment is completed (step 79 in FIG. 7). If the evaluation unit 44 of the computer 19 determines that the Y-stigma adjustment has the optimum value, focus adjustment and stigma adjustment practice modes are completed, since all the parameters have the optimum value (step 36 in FIG. 7). When the Y-stigma adjustment does not have the optimum value, a message notifying the intention that the Y-stigma adjustment is required again is displayed on the screen so as to prompt the user to perform the adjustment again. Here, similar to Embodiment 1, a process of scoring may be performed which evaluates a state of the user's adjustment.

As described above, the user clearly understands which sequence is acceptable during the adjustment by determining the adjustment procedure in advance as described in the present embodiment. Accordingly, anybody can perform the focus adjustment and the X/Y-stigma adjustments with a constant policy. In this manner, the individual difference no longer exists in the quality of the acquired image. Therefore, even the beginner can sufficiently show the performance of the apparatus. Furthermore, since the practice-purpose image used in the practice function is limited, less storage capacity is required in the storage device for storing the practice-purpose image.

Embodiment 3

In Embodiments 1 and 2, a proper practice-purpose image is displayed after being read from the storage device 21 according to the user's operation. However, a large capacity device such as a hard disk is frequently used in a general storage device, and such a device has a slow reading speed. For this reason, when the operation knob is turned, displaying the image to be displayed on the image display device 18 is delayed. Therefore, the device cannot sufficiently follow up the user's operation and the feeling is different from the actual operational feeling, thereby causing a delay in learning the technology. In this regard, if the simulation is performed for each operation as disclosed in PTL 1, it takes some time for the simulation inappropriately.

In the present embodiment, in order to ensure real-time performance as much as possible, all the practice-purpose images are transferred from the storage device 21 to a high-speed accessible memory 22. It is preferable to perform the transfer when the practice mode is started.

The device configuration and the flow of the practice mode are the same as those in Embodiments 1 and 2, and thus description thereof will be omitted.

Furthermore, when the present embodiment is combined with Embodiment 2, the focus adjustment, the X-stigma adjustment and the Y-stigma adjustment are sequentially performed in this order. Accordingly, it is not necessary to transfer all practice-purpose images to the memory 22 at one time. The images can be divided into an image group included in the practice-purpose image preparation region 81 for the focus adjustment, an image group included in the practice-purpose image preparation region 82 for the X-stigma adjustment and an image group included in the practice-purpose image preparation region 83 for the Y-stigma adjustment, and then can be transferred in a stage where the adjustments in the previous step are respectively completed.

As described above, if the present embodiment is combined with Embodiments 1 and 2, an ability to follow the user's operation is improved, thereby enabling the user to experience the operational feeling as if the user actually observes the sample and enhancing practice efficiency.

Embodiment 4

In Embodiments 1 to 3, the practice image in the initial state is fixed or selected at random. However, the adjustment becomes more difficult as the initial parameter set 61 illustrated in FIGS. 4 and 8 is away from the optimum parameter set 65. As described above, in recent years, the range of users for the charged particle beam apparatus has been broadened and various levels are present in the users. Accordingly, it is not necessarily proper way to provide the practice mode having the same degree of difficulty for all the users.

Therefore, in the present embodiment, a degree of adjustment difficulty is selectable and the initial parameter set 61 is prepared according to the degree of adjustment difficulty. That is, when a mode having a high degree of adjustment difficulty is selected, in the adjustment parameter space in FIGS. 4 and 8, a point far away from the optimum parameter set 65 is set to be the initial parameter set 61. On the other hand, when a mode having a low degree of adjustment difficulty is selected, a point close to the optimum parameter set 65 is set to be the initial parameter set 61.

It becomes necessary to prepare the practice-purpose images included in the practice-purpose image preparation regions since the practice-purpose image preparation regions as illustrated in FIG. 8 are determined for each initial parameter set 61 set as described above. Here, if the initial parameter set 61 is selected from a parameter group included in the practice-purpose image preparation regions 81, 82 and 83, even when the initial parameter set 61 is changed, the same practice-purpose image group can be used. Therefore, it is not necessary to prepare a new practice-purpose image.

In addition, impressions of the practice-purpose image vary depending on which object's image is used in the adjustment. That is, the user cannot always observe a standard sample and has to observe various types of sample different from the standard sample. Therefore, even if it is possible to adjust the sample to have the optimum value with the image of the standard sample, it cannot be said that the user has completely learned the parameter adjustment technology. Accordingly, as the practice-purpose image, it is preferable to prepare images obtained by using a plurality of types of sample or images formed in advance by simulating a plurality of types of sample.

A parameter adjustment space is formed for each sample prepared as the practice-purpose image. Accordingly, for each sample, it is necessary to prepare a plurality of practice-purpose images corresponding to a group of the focus adjustment, the X-stigma adjustment and the Y-stigma adjustment as described in Embodiments 1 to 3.

In the GUI for setting the degree of difficulty as described above, or in the other GUIs, it may be configured so as to be capable of selecting which object is used in the practice mode.

As described above, it is possible to provide the practice mode having degrees of difficulty arranged according to technical levels of the user by combining the present embodiment with Embodiments 1 to 3.

REFERENCE SIGNS LIST 1 electron gun
2 primary electron beam
3 condenser lens
4 X-stigmator
5 Y-stigmator
6 upper deflector
7 lower deflector
8 objective lens
9 sample
10 detector
11 high voltage control circuit
12 focusing lens control circuit 13 X-stigmator control circuit
14 Y-stigmator control circuit
15 deflector control circuit
16 objective lens control circuit
17 detection signal control circuit
18 image display device
19 computer
20 manual operation panel
21 storage device
22 memory
31 focus adjustment knob
32 X-stigma adjustment knob
33 Y-stigma adjustment knob
50 practice-purpose GUI
51 practice-purpose image display unit
52 score button
53 scoring-purpose GUI
54 suitability-unsuitability display unit
55 adjustment completion image display unit
56 ideal image display unit
57 return button
58 completion button
61 initial parameter set
62 focus adjustment path
63 X-stigma adjustment path
64 Y-stigma adjustment path
65 optimum parameter set
81 practice-purpose image preparation region of focus adjustment
82 practice-purpose image preparation region of X-stigma adjustment
83 practice-purpose image preparation region of Y-stigma adjustment

The invention claimed is:

1. A charged particle beam apparatus which requires a focus adjustment and a stigma adjustment when observing a sample, comprising:
   a lens system that focuses a charged particle beam on the sample;
   an X-stigmator that adjusts an X-stigma;
   a Y-stigmator that adjusts a Y-stigma;
   a control unit that controls a focus adjustment of the lens system, an X-stigma adjustment of the X-stigmator and a Y-stigma adjustment of the Y-stigmator;
   a storage unit that stores a practice-purpose image corresponding to each group of the focus adjustment, the X-stigma adjustment and the Y-stigma adjustment which are determined in advance;
   an operation unit that sets the focus adjustment, the X-stigma adjustment and the Y-stigma adjustment according to a user's operation;
   a display unit that displays the practice-purpose image read out from the storage unit corresponding to the group of the focus adjustment, the X-stigma adjustment and the Y-stigma adjustment which are set by the operation unit; and
   an evaluation unit that evaluates deviation from an optimum condition by comparing a predetermined set of optimum parameters with the focus adjustment, the X-stigma adjustment and the Y-stigma adjustment which are set by the user's operation.

2. The charged particle beam apparatus according to claim 1,
   wherein with regard to the focus adjustment, the X-stigma adjustment and the Y-stigma adjustment, a sequence of the adjustments is designated.

3. The charged particle beam apparatus according to claim 2,
   wherein the sequence of the adjustments is designated such that the focus adjustment is performed prior to the X-stigma adjustment and the Y-stigma adjustment.

4. The charged particle beam apparatus according to claim 1, further comprising:
   a memory that can read an image faster than the storage unit,
   wherein the memory reads a plurality of the practice-purpose images out from the storage unit, and
   wherein the practice-purpose image displayed by the display unit is read out via the memory.

5. The charged particle beam apparatus according to claim 1,
   wherein a practice-purpose image in an initial state which is displayed on the display unit before a user's adjustment is selected according to a degree of adjustment difficulty in the focus adjustment, the X-stigma adjustment and the Y-stigma adjustment.

6. The charged particle beam apparatus according to claim 1,
   wherein the practice-purpose image displayed when a user determines that the adjustment is completed is displayed in comparison with an image having optimum values of the focus adjustment, the X-stigma adjustment and the Y-stigma adjustment which are determined in advance.

7. A charged particle beam apparatus which requires a focus adjustment and a stigma adjustment when observing a sample, comprising:
   a lens system that focuses a charged particle beam on the sample;
   an X-stigmator that adjusts an X-stigma;
   a Y-stigmator that adjusts a Y-stigma;
   a control unit that controls a focus adjustment of the lens system, an X-stigma adjustment of the X-stigmator and a Y-stigma adjustment of the Y-stigmator;
   a storage unit that stores a practice-purpose image corresponding to each group of the focus adjustment, the X-stigma adjustment and the Y-stigma adjustment which are determined in advance;
   an operation unit that sets the focus adjustment, the X-stigma adjustment and the Y-stigma adjustment according to a user's operation;
   a display unit that displays the practice-purpose image read out from the storage unit corresponding to the group of the focus adjustment, the X-stigma adjustment and the Y-stigma adjustment which are set by the operation unit; and
   a memory that can read an image faster than the storage unit,
   wherein the memory reads a plurality of the practice-purpose images out from the storage unit, and
   wherein the practice-purpose image displayed by the display unit is read out via the memory.

8. A charged particle beam apparatus which requires a focus adjustment and a stigma adjustment when observing a sample, comprising:
   a lens system that focuses a charged particle beam on the sample;
   an X-stigmator that adjusts an X-stigma;
   a Y-stigmator that adjusts a Y-stigma;
   a control unit that controls the focus adjustment of the lens system, an X-stigma adjustment of the X-stigmator and a Y-stigma adjustment of the Y-stigmator;
   a storage unit that stores a practice-purpose image corresponding to each group of the focus adjustment, the X-stigma adjustment and the Y-stigma adjustment which are determined in advance;

an operation unit that sets the focus adjustment, the X-stigma adjustment and the Y-stigma adjustment according to a user's operation; and a display unit that displays the practice-purpose image read out from the storage unit corresponding to the group of the focus adjustment, the X-stigma adjustment and the Y-stigma adjustment which are set by the operation unit, wherein the practice-purpose image displayed when a user determines that the adjustment is completed is displayed in comparison with an image having optimum values of the focus adjustment, the X-stigma adjustment and the Y-stigma adjustment which are determined in advance.

* * * * *